(12) United States Patent
Alvarado

(10) Patent No.: US 10,624,226 B1
(45) Date of Patent: Apr. 14, 2020

(54) PRINTED CIRCUIT BOARD RETENTION BRACKET

(71) Applicant: DELL PRODUCTS, L.P., Round Rock, TX (US)

(72) Inventor: Daniel Alvarado, Plugerville, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/214,204

(22) Filed: Dec. 10, 2018

(51) Int. Cl.
*G06F 1/18* (2006.01)
*H05K 7/14* (2006.01)
*H05K 5/02* (2006.01)

(52) U.S. Cl.
CPC ........... *H05K 7/1431* (2013.01); *G06F 1/185* (2013.01); *G06F 1/186* (2013.01); *H05K 5/0256* (2013.01)

(58) Field of Classification Search
CPC ................................. G06F 1/185; G06F 1/186
USPC ..................................................... 361/679.32
See application file for complete search history.

(56) References Cited

U.S. PATENT DOCUMENTS

| | | | | |
|---|---|---|---|---|
| 3,848,953 A * | 11/1974 | Petroshanoff | ........ | H05K 7/1407 439/327 |
| 4,124,878 A * | 11/1978 | Ebner | ................... | H05K 7/1424 361/756 |
| 5,214,572 A * | 5/1993 | Cosimano | ............... | G06F 1/184 211/41.17 |
| 5,734,551 A * | 3/1998 | Hileman | .................. | G06F 1/184 361/695 |
| 5,743,606 A * | 4/1998 | Scholder | .................. | F16B 12/26 220/786 |
| 5,947,571 A * | 9/1999 | Ho | .......................... | G06F 1/184 312/223.2 |
| 5,963,424 A * | 10/1999 | Hileman | .................. | G06F 1/206 361/679.48 |
| 5,995,364 A * | 11/1999 | McAnally | ............... | G06F 1/187 361/679.31 |
| 6,220,887 B1 * | 4/2001 | Downs | ............... | H01R 12/7005 361/801 |
| 6,349,029 B1 * | 2/2002 | Leman | ...................... | G06F 1/18 16/221 |
| 6,353,541 B1 * | 3/2002 | Leman | .................... | G06F 1/183 211/41.17 |
| 6,356,438 B1 * | 3/2002 | Leman | .................... | G06F 1/183 206/701 |
| 6,430,041 B1 * | 8/2002 | Johnson | .................. | G06F 1/181 165/126 |

(Continued)

*Primary Examiner* — Adrian S Wilson
(74) *Attorney, Agent, or Firm* — Isidore PLLC

(57) ABSTRACT

A method, an information handling system (IHS), and a bracket component for use in an IHS to better retain an inserted expansion card. The bracket component includes a first arm with a surface configured to fasten to a portion of a computer chassis. The portion of the computer chassis is proximate to a printed circuit board (PCB) expansion slot of the computer chassis. The bracket component includes a second arm positioned perpendicular to the first arm. The second arm has an inner surface facing the PCB expansion slot. The bracket component includes a board support pad affixed to the inner surface of the second arm. The board support pad has a flexible surface layer for abutting an edge of one or more PCBs that are inserted into the PCB expansion slot. The board support pad of the bracket component stabilizes the PCBs and reduces vibrations emanating from the computer chassis.

20 Claims, 7 Drawing Sheets

(56) References Cited

U.S. PATENT DOCUMENTS

| | | | | |
|---|---|---|---|---|
| 6,466,448 B1* | 10/2002 | Baik | ............ | G06F 1/183 |
| | | | | 361/752 |
| 6,587,342 B1* | 7/2003 | Hsu | ............ | G06F 1/20 |
| | | | | 165/80.3 |
| 8,081,444 B2* | 12/2011 | Xiao | ............ | G06F 1/20 |
| | | | | 312/223.2 |
| 8,300,409 B2* | 10/2012 | Wei | ............ | F15D 1/0005 |
| | | | | 361/689 |
| 2006/0109636 A1* | 5/2006 | Hood, III | ............ | G06F 1/184 |
| | | | | 361/792 |
| 2009/0129002 A1* | 5/2009 | Wu | ............ | G06F 1/185 |
| | | | | 361/679.4 |
| 2010/0246114 A1* | 9/2010 | Farrow | ............ | G06F 1/183 |
| | | | | 361/679.4 |
| 2012/0320551 A1* | 12/2012 | Sun | ............ | H01R 12/73 |
| | | | | 361/785 |
| 2013/0107454 A1* | 5/2013 | Wilke | ............ | H05K 7/20727 |
| | | | | 361/694 |
| 2014/0211402 A1* | 7/2014 | Wu | ............ | G06F 1/186 |
| | | | | 361/679.32 |
| 2015/0003001 A1* | 1/2015 | Yin | ............ | G06F 1/186 |
| | | | | 361/679.32 |
| 2015/0003004 A1* | 1/2015 | Wu | ............ | G06F 1/185 |
| | | | | 361/679.32 |

* cited by examiner

PRINTED CIRCUIT BOARD RETENTION BRACKET

BACKGROUND

1. Technical Field

The present disclosure generally relates to information handling systems and in particular to a bracket for retaining printed circuit boards in an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Hardware components such as Peripheral Component Interconnect Express (PCIe) cards are internal devices that connect to a PCIe interface of an information handling system. The PCIe interface allows high bandwidth communication between PCIE cards and the motherboard, as well as other hardware of the information handling system. PCIe cards can be, for example, a video graphics card, small computer system interface (SCSI) card, Redundant Array of Independent Disks (RAID) expansion card, Universal Serial Bus (USB) port card, and television tuner card. Expansion cards typically fit into a compatible slot within the information handling system. However, heavy half height PCIe cards installed in full height slots in servers are often not supported down the length of the card or at the card end. Inserting these half-height PCIe cards, which have an uneven distribution of weight leads to the cards becoming damaged during transport.

BRIEF SUMMARY

Disclosed are a method, an information handling system, and a bracket component for use in an information handling system to better retain an inserted expansion card. The bracket component includes a first arm with a surface that is configured to fasten to a portion of a computer chassis. The portion of the computer chassis is proximate to a printed circuit board (PCB) expansion slot connected to the computer chassis. The bracket component includes a second arm positioned perpendicular to the first arm. The second arm has an inner surface that faces the PCB expansion slot. The bracket component includes a board support pad affixed to the inner surface of the second arm. The board support pad has a flexible surface layer for abutting an edge of one or more printed circuit boards that are inserted into the PCB expansion slot. The board support pad of the bracket component stabilizes the one or more PCBs and reduces vibrations emanating from the computer chassis or components operating therein.

According to another embodiment, the method includes forming a bracket component having a first arm that has a surface that is configured to fasten to a portion of a computer chassis. The portion of the computer chassis is proximate to a printed circuit board (PCB) expansion slot connected to the computer chassis. The method includes forming the bracket component with a second arm positioned perpendicular to the first arm and connected to and extending from the first arm at one end. The second arm has an inner surface facing the PCB expansion slot. The method includes attaching a board support pad to an inner surface of the second arm. The board support pad is a flexible surface layer for abutting an edge of one or more PCBs inserted into the PCB expansion slot, and the board support pad mitigates vibration of the one or more PCBs. The method includes creating a hole in a first part of the first arm that aligns with a post associated with a computer chassis. The method includes affixing a fastener to a second part of the first arm that fastens to at least one portion of the computer chassis to hold/maintain the inserted PCB in place.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a method, and information handling system, and a bracket component for use to stabilize one or more printed circuit boards inserted in a printed circuit board expansion slot of an information handling system (IHS).

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
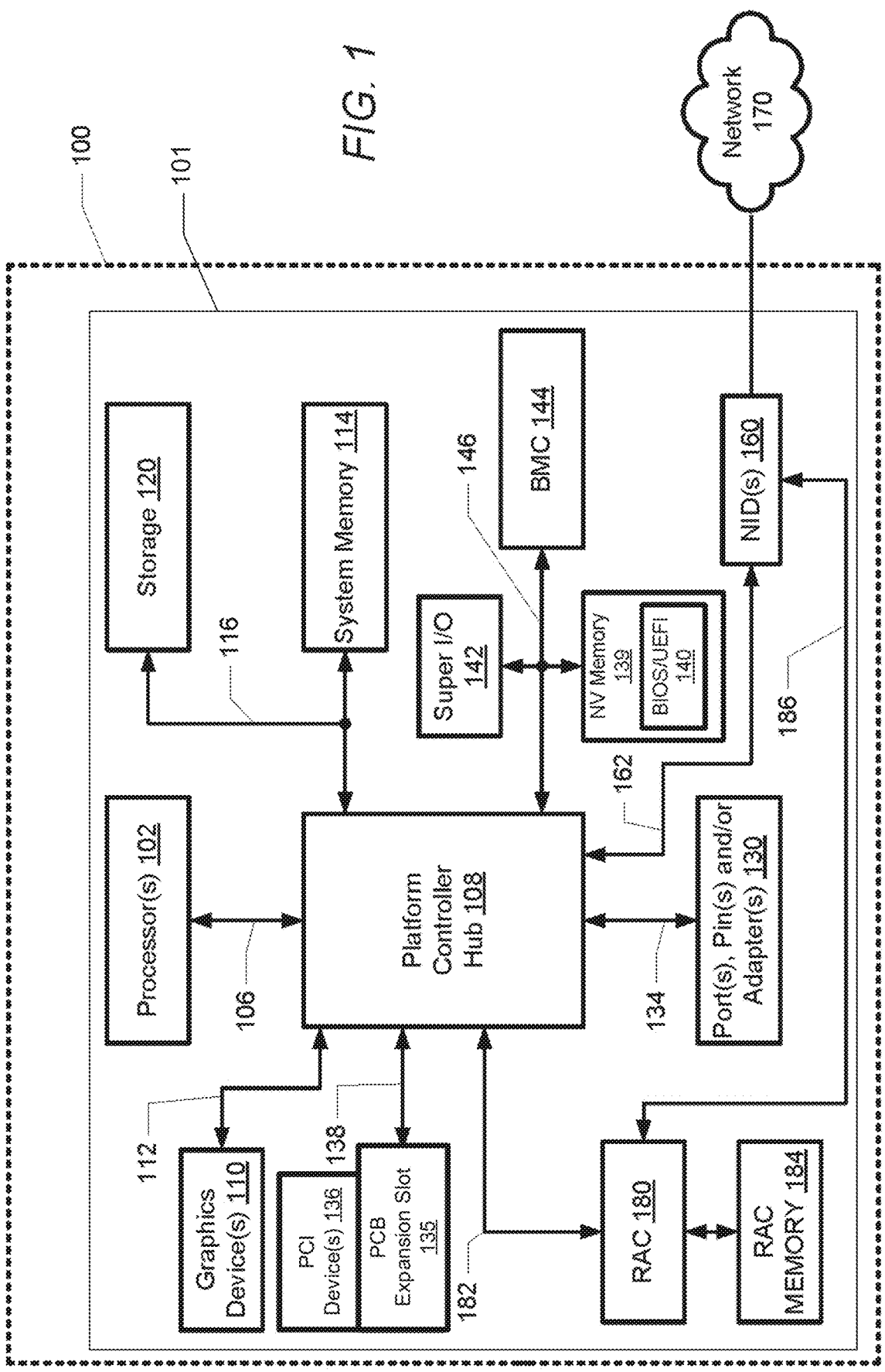
FIG. 1 illustrates one example of an IHS within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or an aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, an example of an IHS 100 is shown. In the described embodiment, IHS 100 includes motherboard 101. Motherboard 101 is configured to provide structural support, power, and electrical connectivity between the various components of IHS 100. Motherboard 101 may include multiple connector sockets in various configurations, adapted to receive pluggable circuit cards, component chip packages, etc. IHS 100 includes one or more processor(s) 102. In various embodiments, IHS 100 may be a single-processor system including one processor 102, or a multi-processor system including two or more processor(s) 102 (e.g., two, four, eight, or any other suitable number). Processor(s) 102 includes any processor capable of executing program instructions.

Processor(s) 102 are coupled to platform controller hub (PCH) or chipset 108 via front-side bus 106. PCH 108 may be configured to coordinate I/O traffic between processor(s) 102 and other components. For example, in this particular implementation, PCH 108 is coupled to graphics device(s) 110 (e.g., one or more video cards or adaptors, etc.) via graphics bus 112 (e.g., an Accelerated Graphics Port (AGP) or AGP bus, a Peripheral Component Interconnect (PCI) bus, etc.). PCH 108 is also coupled to system memory 114 via memory bus 116. System memory 114 may be configured to store program instructions and/or data, accessible by processor(s) 102. In various embodiments, system memory 114 may be implemented using any suitable memory technology, such as static RAM (SRAM), synchronous dynamic RAM (SDRAM), nonvolatile/Flash-type memory, or any other type of memory.

Also coupled to memory bus 116 is storage device or storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 114 during operation of IHS 100.

PCH 108 is also coupled to one or more PCB expansion slot 135 via PCI bus 138. PCI expansion slot 135 connects to one or more PCI devices 136 (e.g., modems, network cards, sound cards, video cards, shared memory etc.). PCI devices 136 are printed circuit boards that connect to printed circuit board (PCB) expansion slot 135. In one embodiment, PCI devices 136 include one or more half height peripheral component interconnect express (PCIe) boards, and the PCB expansion slot 135 is a PCIe riser slot. PCH 108 is further coupled to port(s), pin(s), and/or adapter(s) 130 over bus 134. Generally, PCH 108 may be configured to handle various I/O operations, and PCH 108 may provide interfaces such as, for instance, Universal Serial Bus (USB), audio, serial, parallel, Ethernet, and other interfaces, via port(s), pin(s), and/or adapter(s) 130 over bus 134. For example, PCH 108 may be configured to allow data to be exchanged between IHS 100 and other devices, such as other IHSs attached to a network. In various embodiments, PCH 108 may support communication via wired or wireless general data networks, such as any suitable type of Ethernet network, via telecommunications/telephony networks, such as analog voice networks or digital fiber communications networks, via storage area networks such as Fiber Channel SANs, or via any other suitable type of network and/or protocol.

PCH 108 may also enable connection to one or more input devices, such as keyboards, keypads, touch screens, scanning devices, voice or optical recognition devices, or any other devices suitable for entering or retrieving data. Multiple I/O devices may be present in IHS 100. In some embodiments, I/O devices may be separate from IHS 100 and may interact with IHS 100 through a wired or wireless connection. PCH 108 is coupled to a non-volatile storage or non-volatile memory 139 that stores a basic input output system/unified extensible firmware interface (BIOS/UEFI) 140 via Low Pin Count (LPC) bus 146. PCH 108 is also coupled to super I/O Controller 142 and baseboard management controller (BMC) 144 via LPC bus 146.

BIOS/UEFI 140 is stored on non-volatile memory 139 and includes program instructions stored thereon. Those instructions may be usable by processor(s) 102 to initialize and test other hardware components and/or to load an Operating System (OS) onto IHS 100. As such, (BIOS/UEFI) 140 may include a firmware interface that allows processor(s) 102 to load and execute certain firmware, as described in more detail below. In some cases, such firmware may include program code that is compatible with the Unified Extensible Firmware Interface (UEFI) specification, although other types of firmware may be used.

In one or more embodiments, BMC 144 includes non-volatile memory 139 having program instructions stored thereon that are usable by processors(s) 102 to enable remote management of IHS 100. For example, BMC 144 may enable a user to discover, configure, and manage BMC 144, setup configuration options, resolve and administer hardware or software problems, etc. Additionally or alternatively, BMC 144 may include one or more BMC firmware volumes, each volume having one or more firmware files used by the BIOS' firmware interface to initialize and test components of IHS 100. Super I/O Controller 142 combines interfaces for a variety of lower bandwidth or low data rate devices. Those devices may include, for example, floppy disks, parallel ports, a keyboard and mouse and other devices.

In some cases, IHS 100 may be configured to access different types of computer-accessible media separate from system memory 114. Generally speaking, a computer-accessible memory device may include any tangible, non-transitory storage media or memory media such as electronic, magnetic, or optical media (e.g., magnetic disk, a hard drive, a CD/DVD-ROM, a Flash memory, etc.) coupled to IHS 100 via PCH 108.

IHS 100 further comprises one or more network interface devices (NID(s)) 160 coupled to PCH 108 via PCI bus 162. NID(s) 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID 160 enables IHS 100 to be connected to these other devices. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

IHS 100 further includes a remote access controller (RAC) 180 coupled via a PCI bus 182 to PCH 108. RAC 180 provides management functions that allow an administrator to deploy, monitor, manage, configure, update, troubleshoot and remediate IHS 100. RAC 180 is also coupled to RAC memory 184. In one embodiment, RAC memory 184 can be shared with processor(s) 102. RAC 180 is also communicatively coupled to NID(s) 160 via a sideband bus 186.

RAC 180 monitors and controls the operations of IHS 100 and other systems and devices communicatively coupled to IHS 100. RAC 180 can also perform configuration and remote control of other connected IHSs. Certain software and/or firmware modules stored in RAC memory 184 can be executed by RAC 180. Processor(s) 102 and RAC 180 include specific firmware that enables processor(s) 102 and RAC 180 to perform the various functions described herein.

A person of ordinary skill in the art will appreciate that IHS 100 is merely illustrative and is not intended to limit the scope of the disclosure described herein. In particular, any computer system and/or device may include any combination of hardware or software capable of performing certain operations described herein. For instance, although IHS 100 is illustrated following a first type architecture, various systems and methods described herein may be adapted to work with any other architecture having a different chipset and/or RAC configuration. In addition, the operations performed by the illustrated components may, in some embodiments, be performed by fewer components or distributed across additional components. Similarly, in other embodiments, the operations of some of the illustrated components may not be performed and/or other additional operations may be available.

In other implementations, one or more of the devices or components shown in FIG. 1 may be absent, or one or more other components may be added. Accordingly, systems and methods described herein may be implemented or executed with other computer system configurations.

Figure 2:
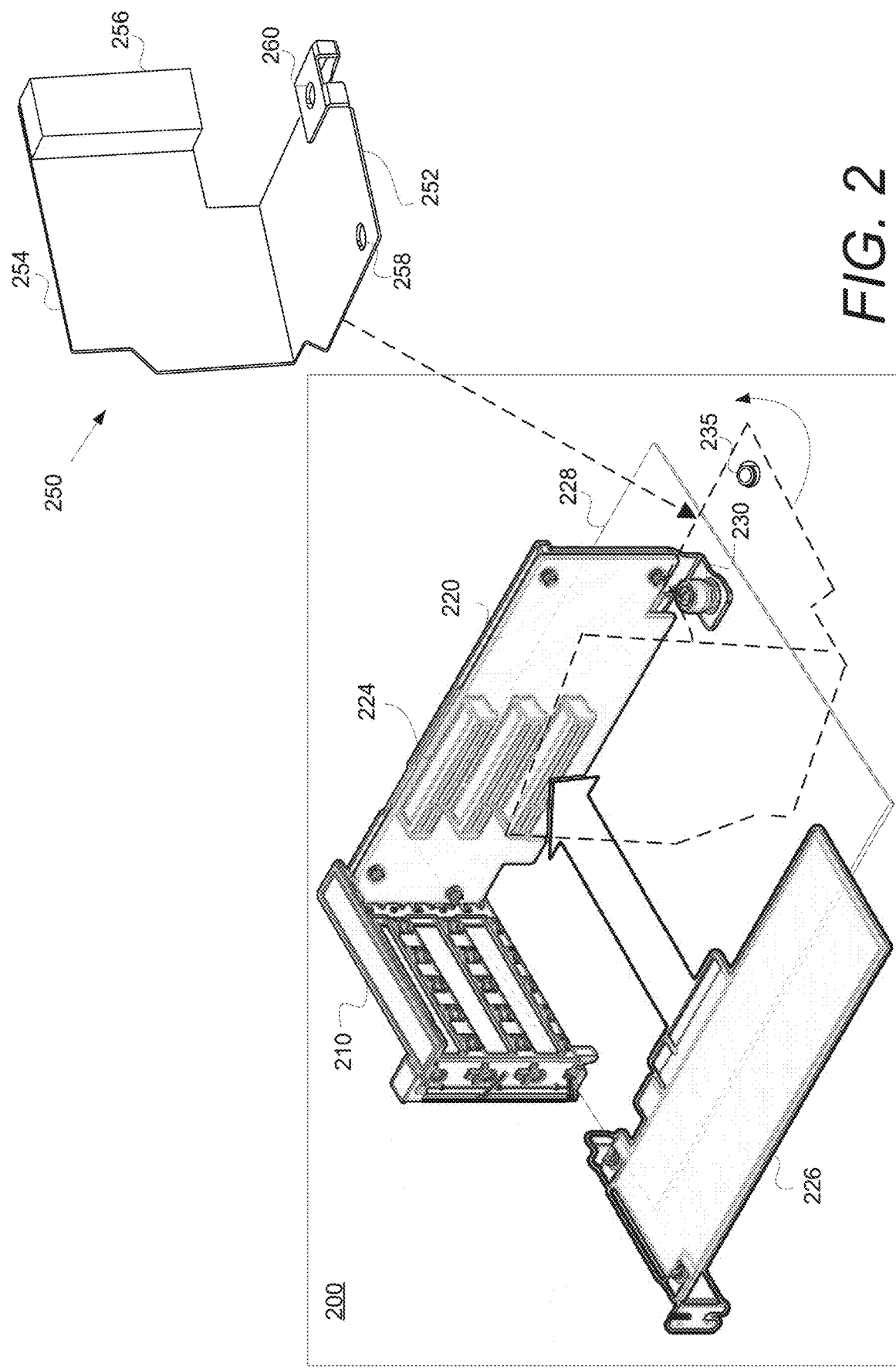
FIG. 2 illustrates example components of a printed circuit board (PCB) expansion slot, PCB expansion device, and a bracket component for use in the IHS of FIG. 1, in accordance with one embodiment.

With reference now to FIG. 2. FIG. 2 illustrates example components of a printed circuit board (PCB) expansion card riser, PCB expansion device, and a bracket component for use in the IHS of FIG. 1, in accordance with one embodiment. PCB expansion subsystem 200 includes PCB mount bracket 210, PCB expansion card riser 220, PCB expansion device 226, computer chassis 228 (illustrated in part), and bracket component 250.

PCB expansion card riser 220 includes one or more PCB expansion slots 224 for receiving one or more PCB expansion devices 226. PCB expansion card riser 220 is connected to a mounting tray and/or PCB mount bracket 210 and affixed to computer chassis 228 of IHS 100. PCB expansion slots 224 provide a connection between PCB expansion device(s) 226 and IHS 100. PCB expansion card riser 220 connects to PCB mount bracket 210. PCB mount bracket 210 can be configured to support one or more PCB expansion devices 226. According to one or more aspects, PCB expansion device(s) 226 is a PCB.

In one embodiment, the printed circuit boards are integrated circuit cards designed to accommodate the high-speed serial computer expansion bus standard of Peripheral Component Interconnect Express (PCIE), or PCIE cards. Likewise, PCB expansion slot 224 is designed to accommodate the high-speed serial computer expansion bus standard of Peripheral Component Interconnect Express (PCIE). PCIE cards expand the capabilities and/or operations of IHS 100. PCB expansion device(s) 226 include, but are not limited to, half-height half-length PCIE cards. The connection between PCB expansion device(s) 226 and IHS 100 is an interconnect or "link". The link is provided by a dedicated, bi-directional, serial, point-to-point connection known as a "lane". A lane is capable of simultaneously transferring 250 MB/s of data in each direction. A link can use more than one lane at a time but all links compliant with the PCIE specification must minimally support single-lane connections, referred to as "x1" (pronounced "by-one") links. Each PCIE card includes a respective number of data lanes, and each data lane increases bandwidth to the host device (IHS 100). In one embodiment, at least one of PCB expansion slots 224 can optionally support links that utilize multiple simultaneous lanes, for example, a "x16" link uses 16 lanes. PCB expansion slot 224 is pre-configured to accommodate x1, x4, x8, and x16 links. PCB expansion devices 226 can physically fit into PCB expansion slots 224 designed for a specified lane configuration or higher (up-plugging). In one embodiment, PCB expansion devices 226 can fit into PCB expansion slots 224 when a respective PCB expansion slot is designed with an open end and has space to receive the larger dimensioned PCB expansion devices 226 in the lower lane configurations (down-plugging). For example, a x1 card will fit into x1, x4, x8, and x16 slots but a x16 card will only fit into a x16 slot if the ends of the x1, x4, and x8 are not open.

Bracket component 250 connects to an area of IHS 100 that is proximate to PCB expansion card riser 220. Bracket component includes first arm 252, second arm 254, board support pad 256, hole 258, and bracket mounting hole 260. Bracket component 250 is configured to stabilize one or more PCB expansion devices 226 inserted into one or more PCB expansion slots 224. Bracket component 250 includes a first arm 252, which has a surface that is configured to fasten to a portion of computer chassis 228 proximate to PCB expansion slot 224 connected to computer chassis 228. Bracket component 250 includes second arm 254 that is positioned perpendicular to first arm 252. As illustrated, second arm 254 is attached at a first end/edge of bracket component 250 to the adjacent end of first arm 252 and extends perpendicularly away from the adjacent end of first arm 252. Second arm 254 has an inner surface facing PCB expansion slot(s) 224. Bracket component 250 also includes board support pad 256 that is affixed to the inner surface of second arm 254. Board support pad 256 has a flexible surface layer for abutting an edge of one or more PCB expansion devices 226 that are inserted into one or more PCB expansion slots 224. Board support pad 256 of bracket component 250 stabilizes the one or more PCB expansion devices 226 and reduces vibrations emanating from computer chassis 228 or components operating therein.

In one embodiment, at least a portion of first arm 252 has a hole, hole 258, that can align with a post or raised feature of computer chassis 228. Hole 258 can be positioned around post 235, where post 235 is an existing post or raised area associated with computer chassis 228. Hole 258 enables bracket component 250 to temporarily rotate about post 235 to create a spatial area to freely insert the one or more PCB expansion devices 226 into PCB expansion slot 224. Then, hole 258 enables bracket component 250 to rotate into a position where the one or more PCB devices 226 abut with flexible surface layer 256. Post 235 can be, for instance, a post associated with a disk array controller that is removed and/or repositioned. In another embodiment, post 235 can be associated with a raised feature manufactured as part of computer chassis 228.

In one embodiment, PCB expansion card riser 220 is affixed to computer chassis 228 via fastener 230. Utilizing the same fastener 230, bracket component 250 is affixed to computer chassis 228. In another embodiment, fastener 230 is a different faster from the fastener utilized by PCB expansion card riser 220. Fastener 230 can be, for example, at least one of a screw, a bolt, a clip, and a snap fastener. Fastener 230 advantageously secures first arm 252 of bracket component 250 to computer chassis 228 to mitigate vibration of PCB expansion device(s) 226. In still another embodiment, hole 258 is not utilized. Instead, bracket component 250 is positioned near PCB expansion card riser 220 and the bottom surface of first arm 252 abuts to a substantially flat area of computer chassis 228. Flexible surface layer 256 abuts an edge of PCB expansion devices 226. Utilizing fastener 230, bracket component 250 is affixed into a stable position. In one embodiment, fastener 230 can be moved into (i) a first position for enabling movement of the bracket component and (ii) a second position for securely fastening the bracket component to a mounting point of the computer chassis. Hole 258 is positioned around post 235. Bracket mounting hole 260 is rotated into a position that enables flexible surface layer 256 to abut an edge of PCB expansion devices 226 while concurrently aligning over the fastening area utilized by fastener 230.

Figure 3:
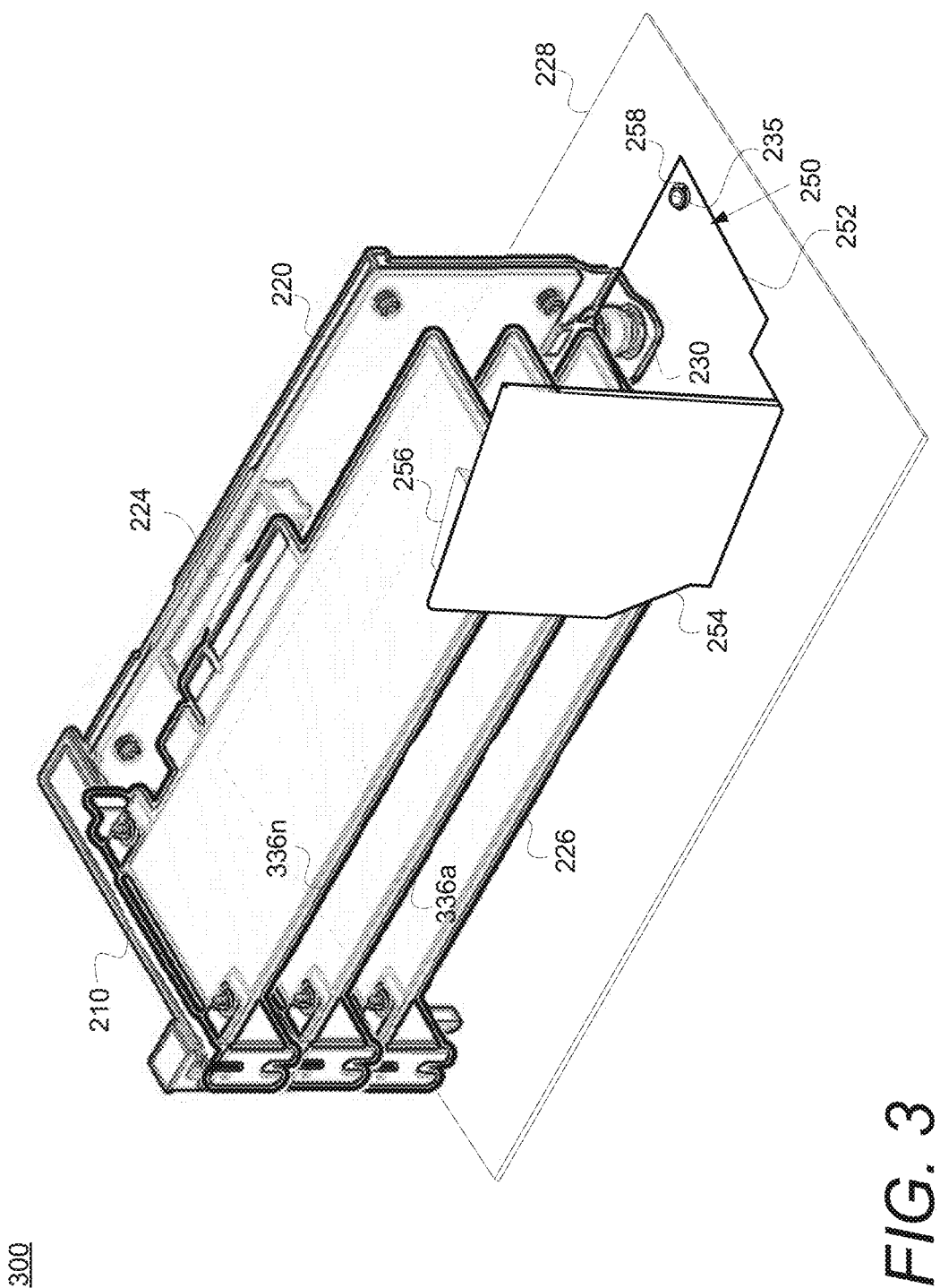
FIG. 3 illustrates example components of a PCB expansion slot having a plurality of PCB devices inserted therein, and a bracket component for use in the IHS of FIG. 1, in accordance with one embodiment.

FIG. 3 illustrates example components of a PCB expansion slot having a plurality of PCB devices inserted therein, and a bracket component for use in the IHS of FIG. 1, in accordance with one embodiment. Similar in configuration to PCB expansion subsystem 200, PCB expansion subsystem 300 includes PCB mount bracket 210, PCB expansion card riser 220, PCB expansion devices 226, 336a-n, computer housing chassis 228, and bracket component 250. PCB expansion subsystem 300 also includes PCB expansion devices 236, 336a-n. PCB expansion card riser 220 includes one or more PCB expansion slots 224 for receiving PCB expansion device 226 and one or more PCB expansion devices 336a-n.

PCB expansion devices 226 and PCB expansion devices 336a-n are printed circuit boards that are inserted into one or more PCB expansion slots 224. In one embodiment, PCB expansion device 226 and PCB expansion devices 336a-n are one or more of half-height PCIE cards, half-length PCIE cards, and full-length PCIE cards. The terms half-height, half-length, and full-length are utilized to describe the physical dimensions of a respective PCIE card. For example, a half-height or low-profile PCIE card is 64.41 mm (height) by 119.91-167.64 mm (long). A half-length PCIE card is 106.68 mm (height)×175.26 mm (long), and a full-length card is 107 mm (height)×312 mm (long). Second arm 254 of the bracket component has a dimensional capacity to concurrently stabilize the one or more peripheral component interconnect express boards. In one embodiment, flexible surface layer 256 affixed to second arm 254 abuts a portion of each of PCB expansion devices 226 and 336*a-n*. In one embodiment, the height of second arm 254 is proportional to the height of PCB mount bracket 210. In another embodiment, the height of second arm 254 is selectively fashioned to stabilize a predetermined number of PCB expansion devices (226 and 336*a-n*). In another embodiment, the height of second arm 254 is selectively fashioned to stabilize a general number of PCB expansion devices (226 and 336*a-n*) when inserted into one or more PCB expansion slots 224.

Figure 4:
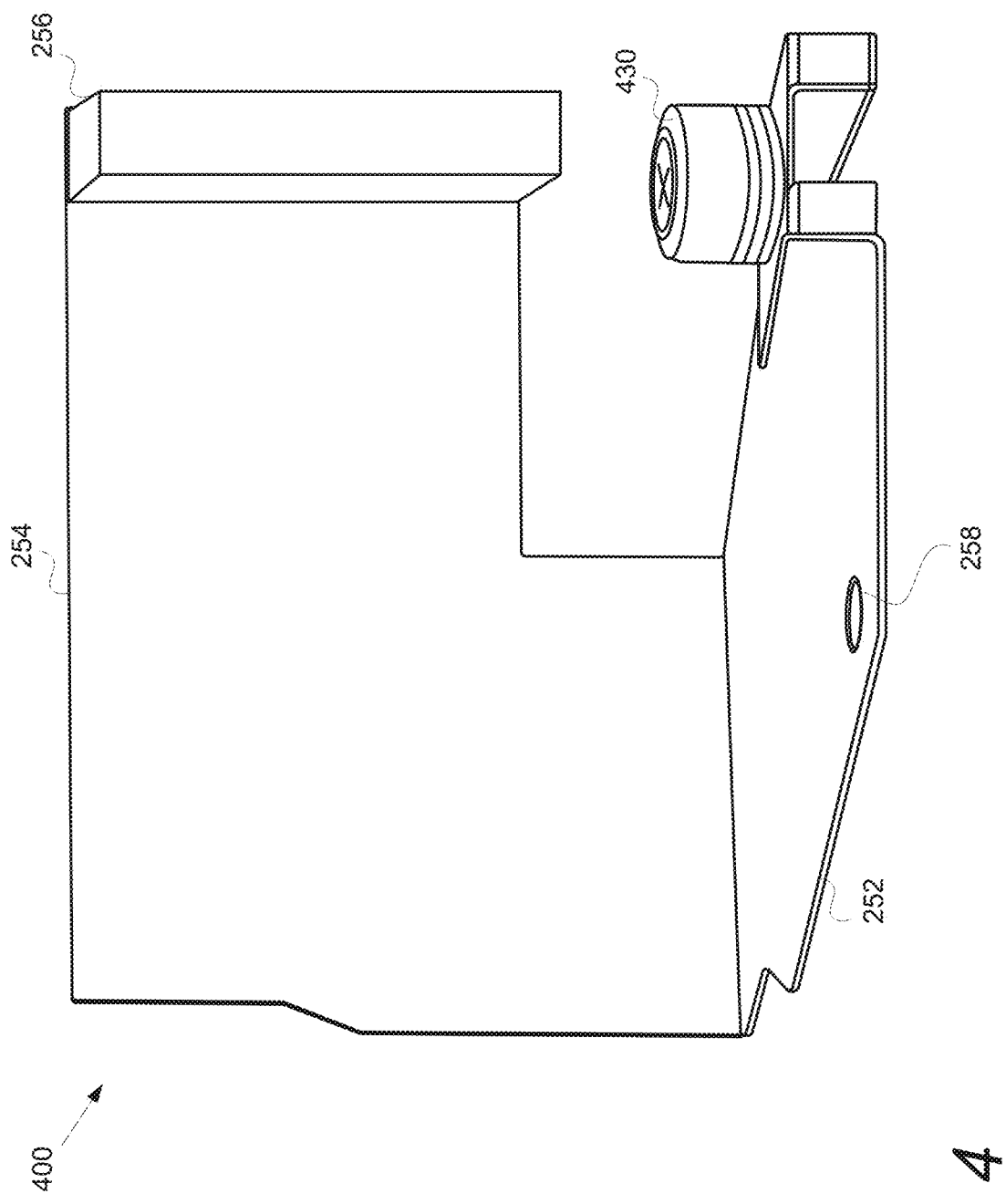
FIG. 4 illustrates an example bracket component for use in the IHS of FIG. 1, in accordance with one embodiment.

FIG. 4 illustrates an example bracket component for use in the IHS of FIG. 1, in accordance with one embodiment. Bracket component 400 illustrates a large-scale view of bracket component 250. Similar in configuration to bracket component 250, bracket component 400 includes first arm 252, second arm 254, board support pad 256, and hole 258. Additionally, bracket component 400 includes fastener 430.

In one embodiment, bracket component 400 is formed, at least in part, from metal. Bracket component 400 can, for instance, be formed from a single section of metal with one or more angles and/or cuts that enable bracket component 400 to be affixed to computer chassis (228) without inadvertently obstructing other components, circuitry, or devices associated with IHS 100. In another embodiment, bracket component 400 can be fashioned from one or more sections of metal coupled together to form bracket component 400. For example, first arm 258 can be welded to second arm 254. In still another embodiment, bracket component 400 is formed, at least in part, from plastic or other rigid material.

In one embodiment, first arm 252 of bracket component 400 is a length that is similar to the height of a first side (short side) of PCB expansion device 226. For instance, first arm 252 of bracket component 400 has a length that is sufficient to allow first arm 252 to be fastened near the base of PCB expansion device 226 and extend to an area past a base edge of PCB expansion device 226, enabling second arm 254 to extend across the top edge of PCB expansion device 226 and board support pad 256 to abut the top edge of PCB expansion device 226. Board support pad 256 is a flexible material that meets a predetermined fire rating code for computer chassis 228. Second arm 254 of bracket component 400 has a dimensional capacity to concurrently stabilize the one or more PCIE boards, for example PCB expansion devices (226 and 336*a-n*).

In one embodiment, fastener 430 secures first arm 252 and thereby bracket component 400 to computer chassis 228. Fastener 430 is utilized to affix bracket component 400 in response to bracket component 400 being positioned to stabilize the one or more PCB expansion devices (226). Fastener 430 secures first arm 252 to computer chassis 228 to mitigate vibration of the one or more PCB expansion devices (226). In one example, fastener 430 is a pre-existing part of computer chassis 228 and bracket component 400 is fashioned to utilize the pre-existing part. In another example, fastener 430 is a separate part, specific to bracket component 400, and is utilized to secure bracket component 400 to computer chassis 228. Fastener 430 can be, for instance, provided on chassis 228 as a mechanism for securing bracket component 400 in place to more securely retain one or more PCB expansion devices (226). Fastener 430 is at least one of a screw, a bolt, a clip, and a snap fastener. As a screw, fastener 430 threads through at least one portion of first arm 252. As a bolt, fastener 430 can mount to a position of computer chassis 228, fixing bracket component 400 in a stationary position. Further, as a bolt, fastener 430 can enable bracket component to pivot in an approximately 180-degree angle, enabling bracket component 400 to be in one or more positions. More specifically, when the bolt is not tightened or fastened, bracket component 400 can be in a first position that enables movement of bracket component 400. In one position, bracket component 400 abuts one or more PCB expansion devices. A less tightened bolt enables bracket component 400 to be rotated to a second position. Tightening the bolt fastens bracket component 400 to a mounting point of the computer chassis. As a clip, fastener 430 attaches to a clampable area associated with computer chassis 228. For instance, a mounting bracket or tray associated with PCB expansion card riser 220 or clampable area in vicinity to computer chassis 228 can be utilized to clip bracket component 400 in a stationary position for stabilizing one or more PCB expansion devices (226). As a snap fastener, a first portion of fastener 430 affixes to a second portion of fastener 430, where the second portion of fastener 430 is attached to an area of computer chassis 228.

Figure 5:
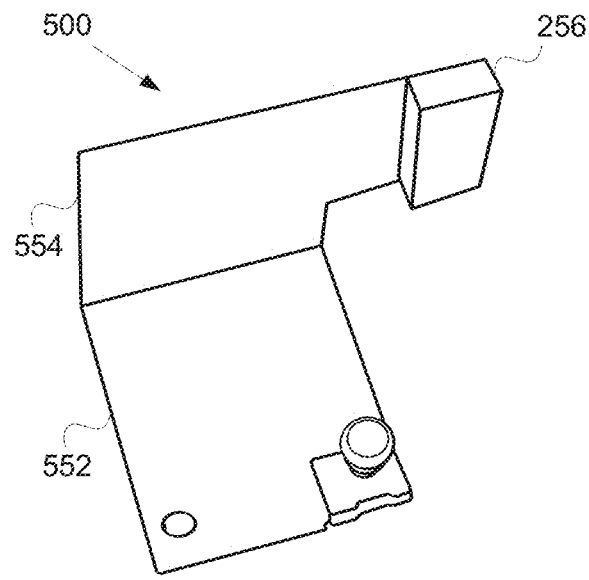
FIG. 5 illustrates a top down right-angle viewpoint of a right-armed bracket component for use in the IHS of FIG. 1, in accordance with one embodiment.

Similar in configuration to bracket component 400, FIG. 5 illustrates a top down right-angle viewpoint of a right-armed bracket component for use in the IHS of FIG. 1, in accordance with one embodiment. Bracket component 500 includes first arm 552, second arm 554, and flexible surface layer 256. The shape and dimension of first arm 552 can be dependent on the mounting area and or surface proximate to the respective PCB expansion devices (226). First arm 552 can include straight edges and/or cuts and grooves that accommodate raised features in computer chassis 228 or components in vicinity to PCB expansion devices (226). Second arm 554 of bracket component 500 is a right-arm. Whether a right-arm or left arm bracket component is utilized is dependent on the position of the one more PCB expansion devices being stabilized. In one embodiment, the one more PCB expansion devices extend to the right of bracket component 500. Stabilizing PCB expansion devices with a right-arm bracket component (500) minimizes obstruction of devices affixed to the left of the PCB expansion devices within IHS 100.

Figure 6:
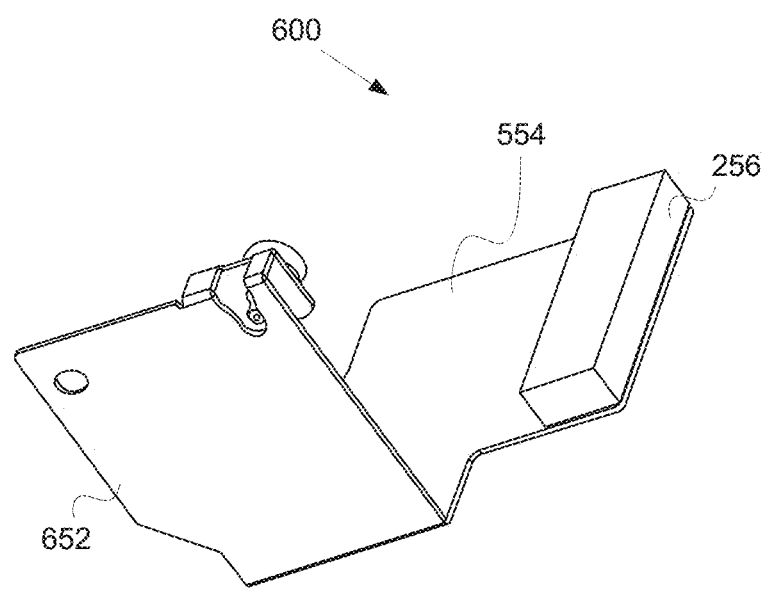
FIG. 6 illustrates a bottom up angled viewpoint of a right-armed bracket component for use in the IHS of FIG. 1, in accordance with one embodiment.

FIG. 6 illustrates a bottom up angled viewpoint of a right-armed bracket component for use in the IHS of FIG. 1, in accordance with one embodiment. Bracket component 600 includes first arm 652, second arm 554, and flexible surface layer 256. In one embodiment, the bottom of first arm 652 is substantially flat for positioning on a substantially flat surface. First arm 652 is fashioned to include a groove that accommodates raised features in computer chassis 228 that are to the left of bracket component 600.

Figure 7:
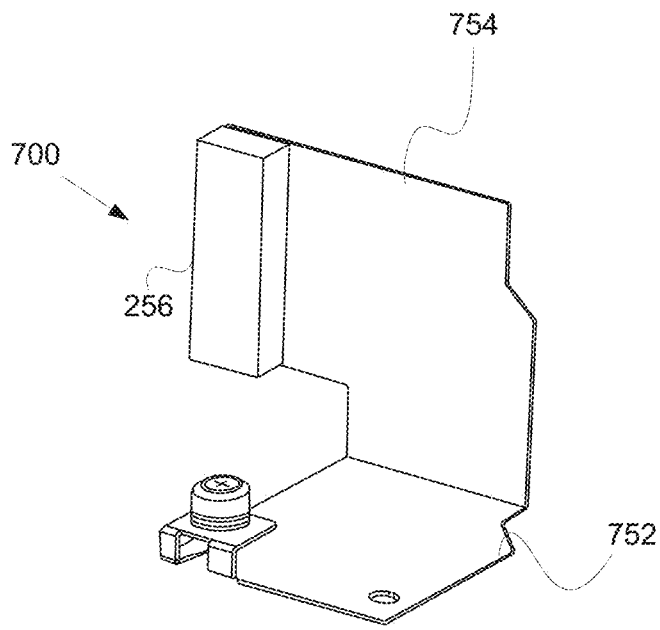
FIG. 7 illustrates a top down left-angle viewpoint of a left-arm bracket component for use in the IHS of FIG. 1, in accordance with one embodiment.

FIG. 7 illustrates a top down left-angle viewpoint of a left-arm bracket component for use in the IHS of FIG. 1, in accordance with one embodiment. Bracket component 700 includes first arm 752, second arm 754, and flexible surface layer 256. In one embodiment first arm 752 is fashioned to include a groove that accommodates raised features in computer chassis 228 that are to the right of bracket component 700. Second arm 754 of bracket component 700 is a left-arm. In one embodiment, left arm bracket component 700 is utilized to stabilize one more PCB expansion devices. In one example, the one or more PCB expansion devices extend to the left of bracket component 700. Therefore, stabilizing PCB expansion devices (226) with a left-arm bracket component (700) can be least obstructive to other components within IHS 100.

Figure 8:
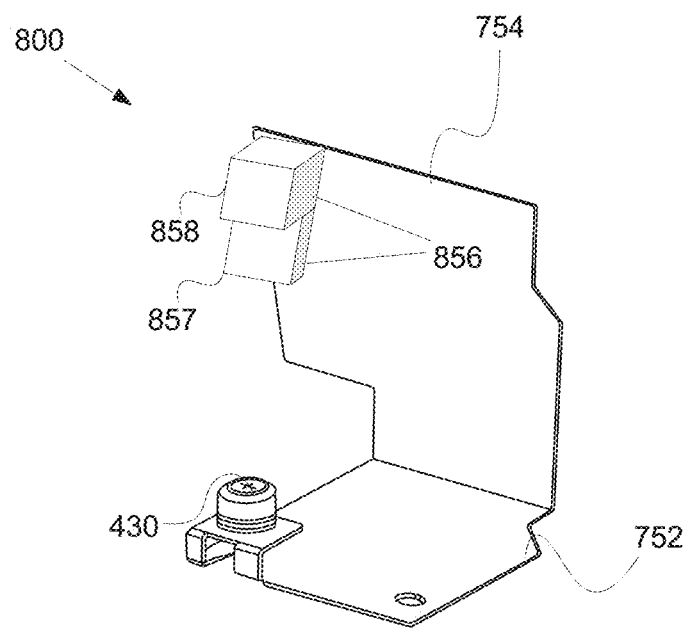
FIG. 8 illustrates a top down left-angle viewpoint of a left-arm bracket component with step-positioned flexible surface layers for use in the IHS of FIG. 1, in accordance with one embodiment.

FIG. 8 illustrates a top down left-angle viewpoint of a left-arm bracket component with step-positioned flexible surface layers for use in the IHS of FIG. 1, in accordance with one embodiment. Bracket component 800 includes first arm 752, second arm 754, and step-positioned flexible surface layers 856 for accommodating one or more PCB expansion devices that have different heights. Step-positioned flexible surface layers 856 includes first step layer 857 and second step layer 858. In one embodiment, a first PCB expansion device has a height that extends beyond a second PCB expansion device. Utilizing step-positioned flexible surface layers 856, bracket component 800 stabilizes both the first PCB expansion device (via first step layer 857) and the second PCB expansion device (via second step layer 858). Step-positioned flexible surface layers 856 can include one or more step changes that accommodate respective heights of PCB expansion devices. In one embodiment, step-positioned flexible surface layers 856 are secured by a sticky adhesive. In the field, step-positioned flexible surface layers 856 can be removed and/or expanded with additional step-positioned flexible surface layers that accommodate respective heights of PCB expansion devices. In another embodiment, each bracket component has step-positioned flexible surface layers 856 that respectively accommodate a combination of heights of PCB expansion devices.

Figure 9:
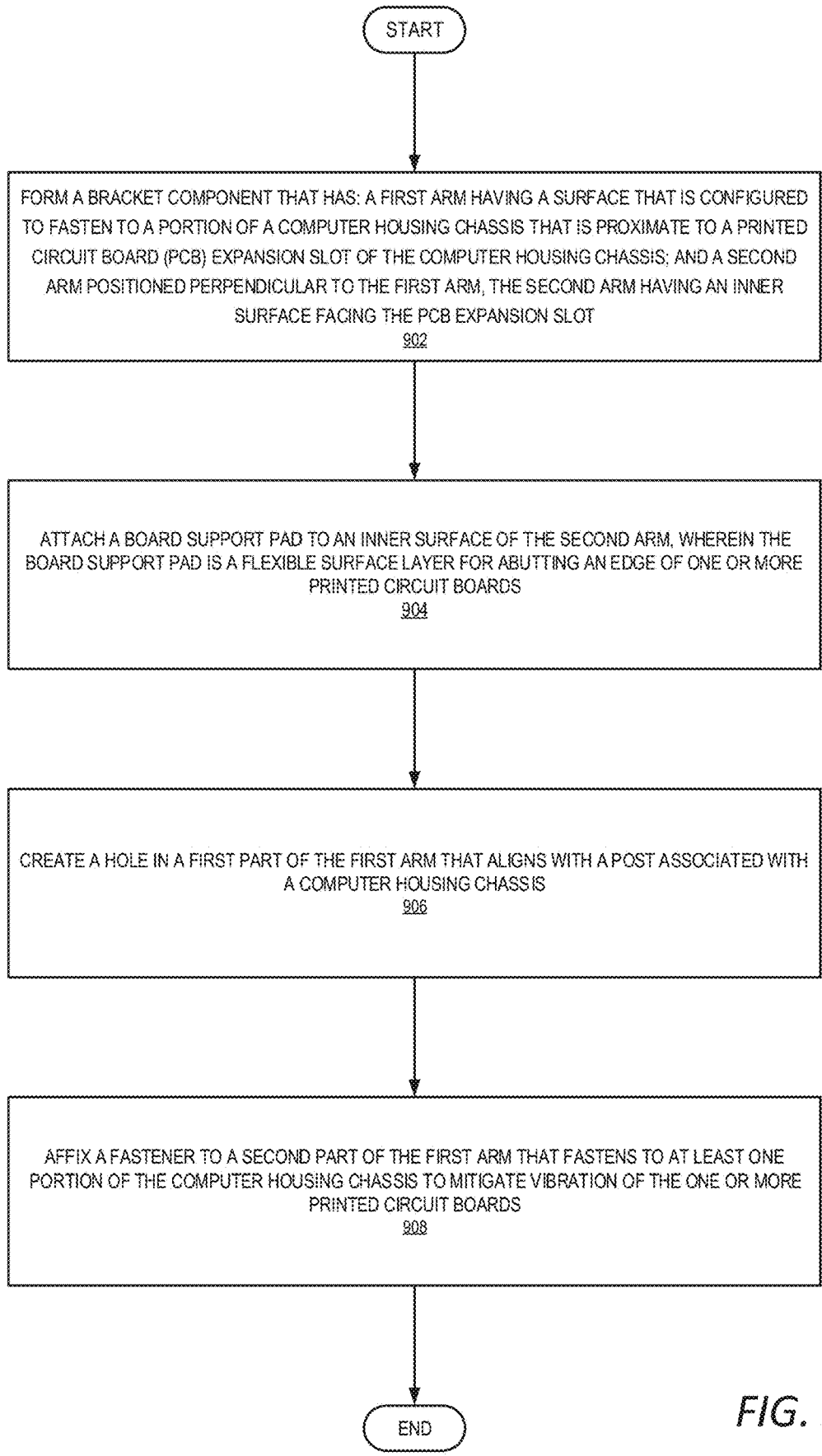
FIG. 9 is a flow chart illustrating one example of a method of forming a bracket component for use in the IHS of FIG. 1, in accordance with one embodiment.

FIG. 9 is a flow chart illustrating one example of a method of forming a bracket component for use in the IHS of FIG. 1, in accordance with one embodiment. Exemplary method 900 of FIG. 9 illustrates a method by which a bracket component such as bracket component 250 is configured using a manufacturing process that includes some form of automated processing. The description of method 900 is provided with general reference to the specific components illustrated within the preceding FIGS. 1-8.

Method 900 commences at the start block, then proceeds to block 902. At block 902, a bracket component (250) is formed having a first arm (252) and a second arm (254) perpendicularly aligned with the first arm. The first arm has a surface that is configured to fasten to a portion of a computer chassis (228). The computer chassis is proximate to a PCB expansion slot of the computer chassis (228). The second arm has an inner surface that faces left or right corresponding to a location of PCB expansion slot (224) when the first arm is secured to a computer chassis. At block 904, board support pad (256) is attached to the inner surface of the second arm (254). The board support pad is a flexible surface layer (256) for abutting an edge of one or more PCBs (226). At block 906, a hole is created in a first part of the first arm (252). The hole aligns with a post associated with a computer chassis. At block 908, a fastener is affixed to a second part of the first arm (252). The fastener fastens to at least one portion of the computer chassis. Fastening the fastener to the computer chassis enables the bracket component to mitigate vibration of the one or more PCBs. The process concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure.

Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A bracket component for use in an information handling system to better retain an inserted expansion card, the bracket component comprising:
    a first arm having a surface that is configured to fasten to a portion of a computer chassis that is proximate to a printed circuit board (PCB) expansion slot connected to the computer chassis, the first arm having a length that is similar to a height of a first side of a PCB expansion device, the length sufficient to allow the first arm to be fastened near a base of the PCB expansion device and extend to an area past a base edge of the PCB expansion device;
    a second arm extending perpendicular to the first arm, the second arm having an inner surface facing the PCB expansion slot; and
    a board support pad affixed to the inner surface of the second arm, the board support pad having a flexible surface layer for abutting an edge of one or more printed circuit boards that are inserted into the PCB expansion slot, the board support pad of the bracket component stabilizing the one or more printed circuit boards and reducing vibrations emanating from the computer chassis or components operating therein;
    the length of the first arm enabling the second arm to extend across a top edge of the PCB expansion device and the board support pad to abut the top edge of the PCB expansion device.

2. The bracket component of claim 1, wherein at least a portion of the first arm has a hole associated with the computer chassis and which aligns with a post associated with the computing chassis, wherein the hole enables the bracket component to temporarily rotate about the post associated with the computer chassis to create a spatial area to freely insert the one or more printed circuit boards into the PCB expansion slot, then enables the bracket component to rotate into a location where a top edge of the one or more printed circuit boards abuts the flexible surface layer.

3. The bracket component of claim 1, further comprising a fastener for securing the first arm to the computer chassis to mitigate vibration of the printed circuit board, wherein the fastener is at least one of a screw, a bolt, a clip, and a snap fastener.

4. The bracket component of claim 3, wherein the fastener can be moved into (i) a first position for enabling movement of the bracket component and (ii) a second position for securely fastening the bracket component to a mounting point of the computer chassis.

5. The bracket component of claim 1, wherein the second arm of the bracket component and the board support pad have a respective dimension that enables the second arm to concurrently stabilize the one or more printed circuit boards (PCB) inserted into one or more PCB expansion slots, wherein a height of the second arm is proportional to a height of the PCB mount bracket, and the height of the second arm is selectively fashioned to stabilize a predetermined number of PCB expansion devices.

6. The bracket component of claim 1, wherein the first arm and the second arm are formed from one of a metal and a plastic.

7. The bracket component of claim 1, wherein the board support pad is a flexible material that meets a predetermined fire rating code for the computer chassis and comprises a selected one of a straight, single layer board support pad and a board support pad configured with step-positioned flexible surface layers for accommodating one or more PCB expansion devices that have different heights, wherein the step-positioned flexible surface layers comprises one or more step changes that accommodate respective heights of PCB expansion devices.

8. An information handling system comprising:
    a chassis;
    a peripheral component interconnect express riser card, connected to the chassis, for receiving one or more peripheral component interconnect express boards; and
    a bracket component, connected to the chassis and comprising:
        a first arm having a surface that is configured to fasten to a portion of a computer chassis proximate to a printed circuit board (PCB) expansion slot connected to the computer chassis, the first arm having a length that is similar to a height of a first side of a PCB expansion device, the length sufficient to allow the first arm to be fastened near a base of the PCB expansion device and extend to an area past a base edge of the PCB expansion device;

a second arm positioned perpendicular to the first arm and connected to and extending from the first arm at one end, the second arm having an inner surface facing the PCB expansion slot; and a board support pad affixed to the inner surface of the second arm, the board support pad having a flexible surface layer for abutting an edge of one or more printed circuit boards inserted into the PCB expansion slot, the board support pad of the bracket component stabilizing the one or more printed circuit boards and reducing vibrations emanating from the computer chassis or components operating therein;

the length of the first arm enabling the second arm to extend across a top edge of the PCB expansion device and the board support pad to abut the top edge of the PCB expansion device.

9. The electronic device of claim 8, wherein the bracket component further comprises:

a hole that aligns with a post associated with the computer chassis, the hole enabling the bracket component to temporarily rotate about the post to create a spatial area to freely input the one or more printed circuit boards into the PCB expansion slot, and the hole enabling the bracket component to rotate into a location that abuts the one or more printed circuit boards into the flexible surface layer.

10. The electronic device of claim 8, wherein the bracket component further comprises:

a fastener for securing the first arm to the computer chassis to mitigate vibration of the printed circuit board, the fastener having (i) a first position for enabling movement of the bracket component and (ii) a second position for securely fastening the bracket to a mounting point of the computer chassis, wherein the fastener is at least one of a screw, bolt, clip, and snap fastener.

11. The electronic device of claim 8, wherein:

the bracket component is formed from one of a metal and a plastic; and the second arm of the bracket component has a dimensional capacity to concurrently stabilize the one or more peripheral component interconnect express boards inserted into one or more PCB expansion slots, wherein a height of the second arm is proportional to a height of the PCB mount bracket, and the height of the second arm is selectively fashioned to stabilize a predetermined number of PCB expansion devices.

12. A method comprising:

forming a bracket component that has:

a first arm having a surface that is configured to fasten to a portion of a computer chassis that is proximate to a printed circuit board (PCB) expansion slot of the computer chassis, the first arm having a length that is similar to a height of a first side of a PCB expansion device, the length sufficient to allow the first arm to be fastened near a base of the PCB expansion device and extend to an area past a base edge of the PCB expansion device; and a second arm positioned perpendicular to the first arm and connected to and extending from the first arm at one end, the second arm having an inner surface facing the PCB expansion slot;

attaching a board support pad to an inner surface of the second arm, wherein the board support pad is a flexible surface layer for abutting an edge of one or more PCBs inserted into the PCB expansion slot, and the board support pad mitigates vibration of the one or more PCBs;

wherein the length of the first arm enables the second arm to extend across a top edge of the PCB expansion device and the board support pad to abut the top edge of the PCB expansion device;

creating a hole in a first part of the first arm that aligns with a post associated with a computer chassis; and affixing a fastener to a second part of the first arm that fastens to at least one portion of the computer chassis to hold the inserted PCB in place.

13. The method of claim 12, further comprising:

centrally aligning the hole of the bracket component with the post, wherein the bracket component rotates about the post; and in response to the one or more printed circuit boards being inserted into a PCB expansion slot, positioning the bracket component to fasten to the at least one portion of the computer chassis to stabilize the one or more printed circuit boards.

14. The method of claim 12, wherein the fastener has a (i) first position for enabling movement of the bracket component and (ii) a second position for securely fastening the bracket to a mounting point of the computer chassis, wherein the fastener is at least one of a screw, bolt, clip, and snap fastener.

15. The method of claim 12, wherein the bracket component has a dimensional capacity to concurrently stabilize one or more peripheral component interconnect express card inserted into one or more PCB expansion slots, wherein a height of the second arm is proportional to a height of the PCB mount bracket, and the height of the second arm is selectively fashioned to stabilize a predetermined number of PCB expansion devices.

16. The method of claim 15, wherein:

the one or more printed circuit cards are one or more of half-height peripheral component interconnect express cards, half-length peripheral component interconnect express cards, and full-length peripheral component interconnect express cards; and the board support pad is a flexible material that meets a predetermined fire rating code for the computer chassis and comprises a selected one of a straight, single layer board support pad and a board support pad configured with step-positioned flexible surface layers for accommodating one or more PCB expansion devices that have different heights, wherein the step-positioned flexible surface layers comprises one or more step changes that accommodate respective heights of PCB expansion devices.

17. The method of claim 16, further comprising:

adhering the board support pad to the second arm by an adhesive, wherein the step-positioned flexible surface layers can be removed and/or expanded with additional step-positioned flexible surface layers that accommodate respective heights of PCB expansion devices.

18. The bracket component of claim 7, wherein the board support pad is adhered to the second arm by an adhesive and the step-positioned flexible surface layers can be removed and/or expanded with additional step-positioned flexible surface layers that accommodate respective heights of PCB expansion devices.

19. The electronic device of claim 8, wherein the board support pad is a flexible material that meets a predetermined fire rating code for the computer chassis and comprises a selected one of a straight, single layer board support pad and a support pad configured with step-positioned flexible surface layers for accommodating one or more PCB expansion devices that have different heights, wherein the step-positioned flexible surface layers comprises one or more step changes that accommodate respective heights of PCB expansion devices.

20. The electronic device of claim 19, wherein the board support pad is adhered to the second arm by an adhesive and the step-positioned flexible surface layers can be removed and/or expanded with additional step-positioned flexible surface layers that accommodate respective heights of PCB expansion devices.

\* \* \* \* \*